United States Patent [19]

Okazaki

[11] Patent Number: 5,095,511

[45] Date of Patent: Mar. 10, 1992

[54] APPARATUS FOR VERIFYING PATTERN DATA USED IN A STEP-AND-REPEAT PROCESS FOR PRODUCING THE SAME PATTERNS REGULARLY ARRANGED ON A SUBSTANCE

[75] Inventor: Akihiro Okazaki, Yokohama, Japan

[73] Assignee: Fujitsu Limited, Kanagawa, Japan

[21] Appl. No.: 360,535

[22] Filed: Jun. 2, 1989

[30] Foreign Application Priority Data

Jun. 6, 1988 [JP] Japan .................. 63-140258

[51] Int. Cl.$^5$ .............................................. G06K 9/00
[52] U.S. Cl. .......................................... 382/8; 382/1; 382/33; 382/41; 358/101
[58] Field of Search ..................... 382/8, 1, 41, 45, 46, 382/49, 33, 9, 14, 16, 22; 250/563; 356/388, 390, 392; 358/101, 107

[56] References Cited

U.S. PATENT DOCUMENTS

| | | | |
|---|---|---|---|
| 4,745,296 | 5/1988 | Driller et al. | 250/563 |
| 4,853,967 | 8/1989 | Mandeville | 382/8 |
| 4,853,968 | 8/1989 | Berkin | 382/8 |
| 4,872,024 | 10/1989 | Nagai et al. | 346/1.1 |
| 4,984,075 | 1/1991 | Munaoka | 358/107 |
| 4,989,082 | 1/1991 | Hopkins | 358/101 |

Primary Examiner—Michael Razavi
Attorney, Agent, or Firm—Staas & Halsey

[57] ABSTRACT

Chip pattern data, regarding a chip pattern including a chip circuit pattern, a scribe frame pattern which surrounds the chip circuit pattern and which becomes an overlapped region between the chip patterns arranged adjacently each other, and subsidiary patterns located in the scribe frame pattern are applied in a step-and-repeat process for fabricating a photomask are verified by: producing simulation pattern data, from the chip pattern data, for arranging a designated number of chip patterns in the same way as done in the step-and-repeat process; providing a visual image of the simulation pattern from the simulation pattern data; and visually observing, through the visual image, the chip and in particular, the subsidiary patterns appearing in the same state as in the step-and-repeat process.

9 Claims, 5 Drawing Sheets

APPARATUS FOR VERIFYING PATTERN DATA USED IN A STEP-AND-REPEAT PROCESS FOR PRODUCING THE SAME PATTERNS REGULARLY ARRANGED ON A SUBSTANCE

BACKGROUND OF THE INVENTION

1. Field of the Invention

The present invention relates to an apparatus for verifying pattern data used in a step-and-repeat process for producing the same patterns, based on the pattern data, regularly arranged on a substance, and particularly, to an apparatus for verifying chip pattern data used in a step-and-repeat process for producing the same chip patterns regularly arranged on a substance to be a photomask used for fabricating integrated circuit devices.

2. Description of the Related Art

Integrated circuit (IC) devices are usually fabricated by using a plurality of photomasks. Since the IC device becomes very minute as seen in a Large Scale Integration circuit (LSI) device or a Very Large Scale Integration circuit (VLSI) device, a large number of photomasks fabricated with very high accuracy are used in a manner of superimposing for patterning very minute circuits of the IC devices. Furthermore, recently, the life of IC products has become very short, so that new IC devices, and accordingly, new photomasks for the new IC devices have to be always designed and fabricated. Therefore, it becomes very important to raise the yield rate and shorten the expended time of the photomasks for reducing the production costs and expediting the issuing date of the new products of the IC devices.

A photomask pattern has been fabricated through a step-and-repeat process by using optically a reticle image of a chip circuit pattern (base pattern). However, recently, only the data on the chip circuit pattern are directly used in the step-and-repeat process, not the reticle optical image.

The chip circuit pattern is designed by a circuit designer, using a Computer Aided Design (CAD) system, and digital data, which will be called "chip circuit pattern data" ("base pattern data") hereinafter, of a chip circuit pattern of the IC device are made and stored in a data storing medium such as a magnetic tape. The chip circuit pattern data are combined with additional data into combined data, which will be called "chip pattern data" ("unit pattern data") (not "chip circuit pattern data") hereinafter, by a chip data combining system. The additional data will be described later. The photomask is fabricated by an apparatus, generally called a "stepper", for performing the step-and-repeat process, using the chip pattern data and "process data" required to carry out the step-and-repeat process by the stepper.

Figure 1:
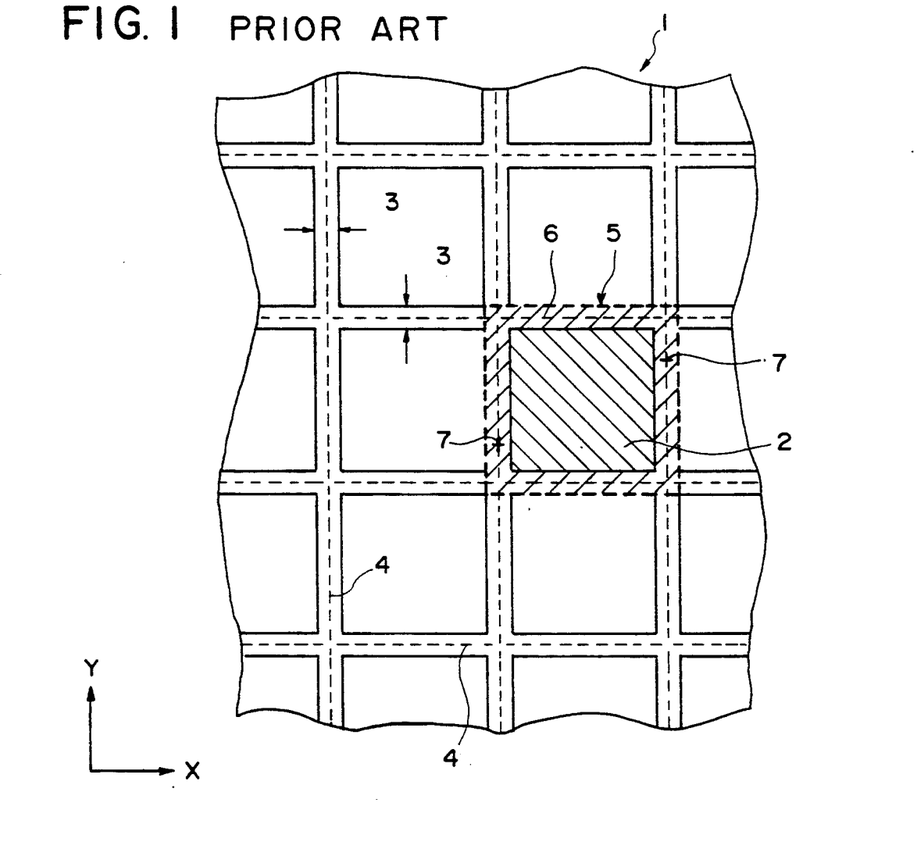
FIG. 1 is a partial schematic drawing of a pattern of photomask.

The photomask pattern includes a plurality of chip circuit patterns usually arranged orthogonally in a matrix so as to have a narrow space between chip circuit patterns adjacent each other in both X and Y directions of the matrix. The narrow space has a width of approximately 100 microns, and a wafer is cut into a plurality of divided IC chips along a center line of each space when all chip circuits for the IC devices have been formed on the wafer by using many kinds of photomasks. Generally, the cutting line in the space is called a "scribe line" and the space surrounding the chip circuit pattern is called a "scribe frame". FIG. 1 shows partially the pattern of a photomask 1. In FIG. 1, chip circuit patterns 2 are arranged in a matrix on X-Y orthogonal coordinates, having an equal space 3 between chip circuit patterns 2 adjacent each other in both X and Y directions. In this situation, scribe lines 4 are supposed to run along center lines of the narrow spaces 3 respectively as shown by thin dotted lines in FIG. 1.

The chip pattern data include information not only on the chip circuit pattern but also on a scribe frame pattern and further on at least one subsidiary pattern located in the scribe frame pattern, which is shown by a chip pattern 5 contained in a thick dotted square in FIG. 1. Thus, the chip pattern data include information for patterning the chip pattern 5 consisting of one chip circuit pattern 2, a scribe frame pattern 6 and subsidiary patterns 7. In FIG. 1, two subsidiary patterns 7 are depicted by "+" marks, because the rotation of the chip pattern can be corrected more precisely than a case of using only one subsidiary pattern.

Each subsidiary pattern 7 includes, for example, a positioning mark and a vernier pattern for inspecting whether each chip circuit pattern of one photomask is correctly projected on a wafer, compared with the chip circuit patterns due to other photomasks. That is, when more than two photomasks are used in the superimposed manner on the wafer, the position, rotation and size of each chip circuit pattern projected on the wafer by the present photomask can be inspected, compared with those having been previously formed on the wafer by other photomasks.

The additional data added to the chip circuit pattern data include information on a chip size, a width of the scribe frame, the subsidiary patterns and a kind of resist used for pattern etching.

As stated before, the chip circuit pattern data and the additional data are combined into the chip pattern data and the photomask is fabricated by applying the chip pattern data to the stepper. However, in this case, there has been a problem in regard to the subsidiary patterns. As shown in FIG. 1, since the chip pattern 5 includes the scribe frame pattern 6 so as to be commonly used with the adjacent chip patterns 5, the subsidiary patterns 7 substantially overlap each other in the step-and-repeat process. The scribe frame pattern 6 has two types, a positive type and a negative type, corresponding to the characteristics of the resist. The positive type pattern is a pattern through which a portion, corresponding to the scribe frame, of a substance of the photomask is not etched, leaving the subsidiary patterns so as to be etched. On the contrary, the negative type pattern is a pattern through which a portion, corresponding to the scribe frame, of the substance is etched, leaving the subsidiary patterns so as not to be etched. Therefore, in the case of the positive type, the substance, where the scribe frame pattern 6 of the chip pattern 5 has been exposed, can be etched by the subsidiary pattern 7 of the neighboring chip pattern 5 without paying any attention. However, in the case of the negative type, it could not be done unless the substance, where the subsidiary pattern 7 of the neighboring chip pattern 5 is supposed to be exposed, is protected from being etched by the scribe frame pattern 6 of the chip pattern 5.

Figure 2:
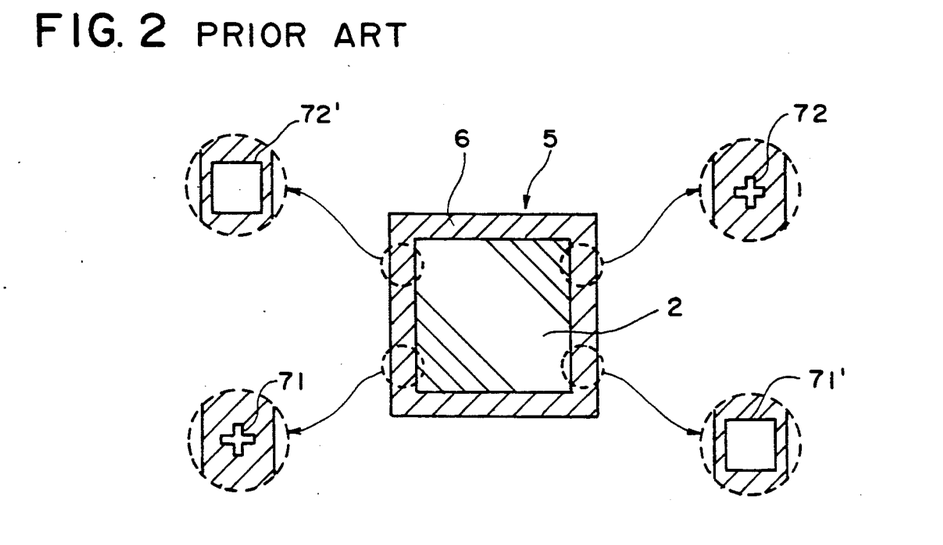
FIG. 2 is a schematic drawing of a chip pattern.

FIG. 2 illustrates a chip pattern in the case of using the chip pattern data including the data on the scribe frame pattern being the negative type. In FIG. 2, the same reference number as in FIG. 1 designates the same pattern as in FIG. 1. If there were no protecting means from exposure, the subsidiary patterns 7 of the neighboring chip patterns could not be formed on the substance of the photomask in the step-and-repeat process. Therefore, portions on the substance, on which other subsidiary patterns 7 of the neighboring chip patterns are projected, from being etched by protecting patterns which will be called "margin patterns" hereinafter. In FIG. 2, solid squares 71' and 72' are the margin patterns for the subsidiary pattern 71 of the one neighboring chip pattern 5 (at the right hand side in FIG. 2) and the subsidiary pattern 72 of the other neighboring chip pattern 5 (at the left hand side) respectively. These subsidiary patterns 71 and 72 and the margin patterns 71' and 72' are depicted in dotted circles enlarged.

A lot of photomasks are required to fabricate the IC devices as stated before, and each photomask requires the chip pattern including the scribe frame pattern of either the positive or the negative type. The selection of the scribe pattern type occurs too often, so that wrong selections frequently take place, even though visual verification of the chip pattern is performed in a simulated way before the chip pattern data are stored in the magnetic tape. This is because too much complicated work of the selection and the verification are required in the fabrication of the photomasks, and this has been the problem to be solved.

SUMMARY OF THE INVENTION

Therefore, an object of the present invention is to improve means of verifying the chip pattern data, particularly verifying whether the data on subsidiary patterns are presented correctly in the chip pattern data, so that the verification can be performed more reliably and simply.

Another object of the present invention is to reduce the production costs of the photomasks.

Yet another object of the present invention is to shorten the expended time of the photomasks.

A further object of the present invention is to reduce the labor required in performing the verification of the chip pattern.

The above objects are accomplished by providing an overlapped pattern verifying apparatus in the chip data combining system, for verifying the data on an overlapped state of the chip patterns so as to verify the data on the the subsidiary patterns in the scribe frame pattern by overlapping a designated number of the chip patterns in a simulated way and visually observing the overlapped chip patterns.

In the overlapped pattern verifying apparatus, the overlapped state of the chip patterns (unit patterns) is verified as follows: 1) The chip pattern data (unit pattern data) comprising of the chip circuit pattern data (base pattern data) and the additional data are sent to repeat processing means in which the data for producing an overlapped pattern of a designated number of the chip patterns are provided 2) The data from the repeat processing means are sent to detecting means for detecting data regarding a doubly exposed zone in the overlapped chip patterns, producing doubly exposed zone data and non-doubly exposed zone data; 3) The doubly exposed zone data from the detecting means are sent to pattern logical multiplication means in which logical pattern multiplication regarding the doubly exposed zone is performed, producing data on subsidiary patterns appearing in the double exposed zone; 4) The non-doubly exposed zone data from the detecting means and the subsidiary pattern data from the pattern logical multiplication means are combined in data combining means, outputting verifying combined data; 5) Overlapped chip patterns are verified in accordance with the verifying combined data, by visually observing the patterns on display means such as a cathode ray tube. Thus, verifying the chip pattern data by visually observing the overlapped pattern of the chip patterns in the way of simulation is a feature of the present invention. Applying the present invention, the yield rate of the photomask's products is raised up to more than 99% from 95%.

DESCRIPTION OF THE PREFERRED EMBODIMENTS

Figure 3:
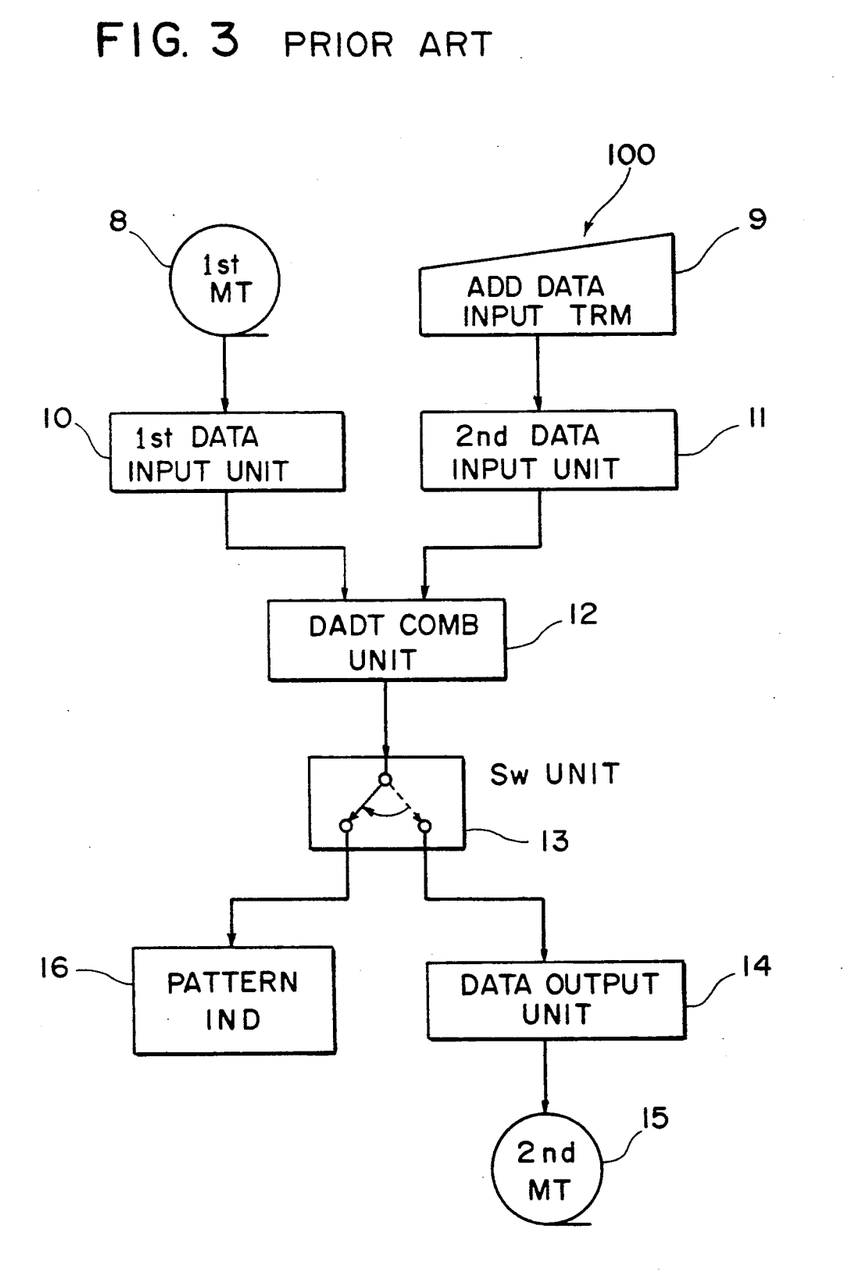
FIG. 3 is a block diagram of a prior art chip data combining system.

The chip pattern data are produced by the chip data combining system, combining the chip circuit pattern data with the additional data, as stated before. FIG. 3 is a block diagram of a prior art chip data combining system 100. In FIG. 3, the prior art chip data combining system 100 functions as follows: the chip circuit pattern data (base pattern data) are read out from a first magnetic tape (1st MT) 8 and sent to a data combining unit (DATA COMB UNIT) 12 through a first data input unit (1st DATA INPUT UNIT) 10; the additional data regarding a chip size, a width of the scribe frame, a kind of resist used for pattern etching, the subsidiary patterns and the margin patterns are input to the system 100 through an additional data input terminal (ADD DATA INPUT TRM) 9; the additional data are sent to the DATA COMB UNIT 12 from the ADD DATA INPUT TRM 9 through a second data input unit (2nd DATA INPUT UNIT) 11; the chip circuit pattern data are combined with the additional data by the DATA COMB UNIT 12, producing the chip pattern data (unit pattern data); the chip pattern data output from the DATA COMB UNIT 12 are sent to a switching unit (SW UNIT) 13 in which the destination of the chip pattern data is selected so that the chip pattern data are sent to a pattern indicator (PATTERN IND) 16 when the system 100 is set in a data verifying mode and are sent to a second magnetic tape (2nd MT) 15 through a data output unit (DATA OUTPUT UNIT) 14 when the system 100 is set in a data storing mode. When the system 100 is set in the data verifying mode, the chip pattern data are sent to the PATTERN IND 16 in which the chip circuit pattern (base pattern), the scribe frame pattern, the subsidiary patterns and the margin patterns are verified by visually observing their patterns through indicator means such as a cathode ray tube. After verifying the chip pattern data by the PATTERN IND 16, the system 100 is set in the data storing mode, then the chip pattern data are stored into the 2nd MT 15. As mentioned above, in the data verifying mode, only the chip pattern data are verified in the prior art. In other words, in the prior art, the verification of the overlapped state of the chip data patterns can not be performed. In regard to this, in the present (unit patterns) invention, the overlapping state of the chip patterns can be verified by an overlapped pattern verifying apparatus which is newly added to the chip data combining system 100. (The chip data combining system including the overlapped pattern verifying apparatus will be referred as a chip data combining system 200 hereinafter.)

Figure 4:
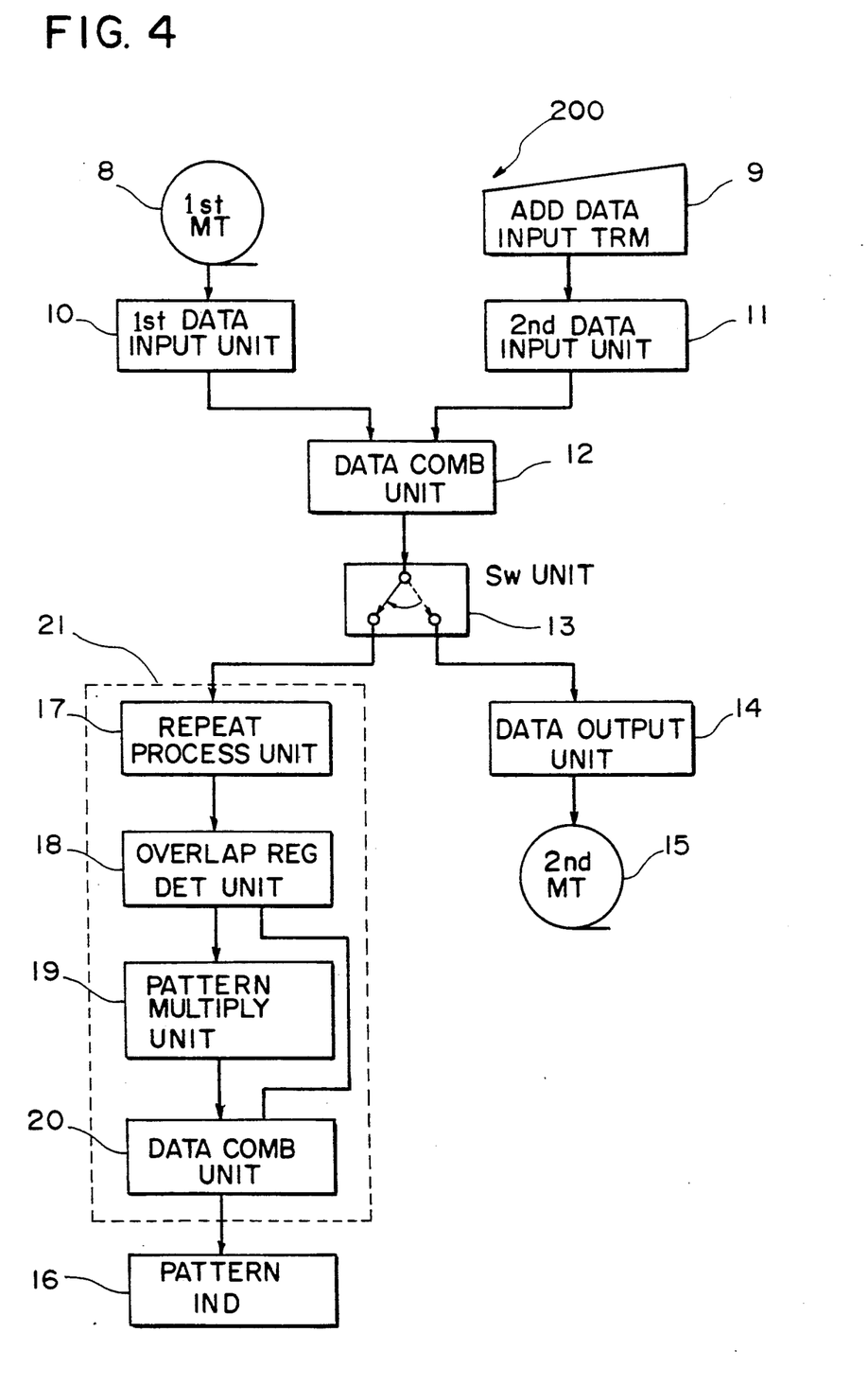
FIG. 4 is a block diagram of a chip data combining system including an overlapped pattern verifying apparatus embodying the present invention.

FIG. 4 shows a block diagram of the chip data combining system 200 including an overlapped pattern verifying apparatus 21 embodying the present invention. In FIG. 4, the same reference number as in FIG. 3 designates the same unit as in FIG. 3.

Figure 5:
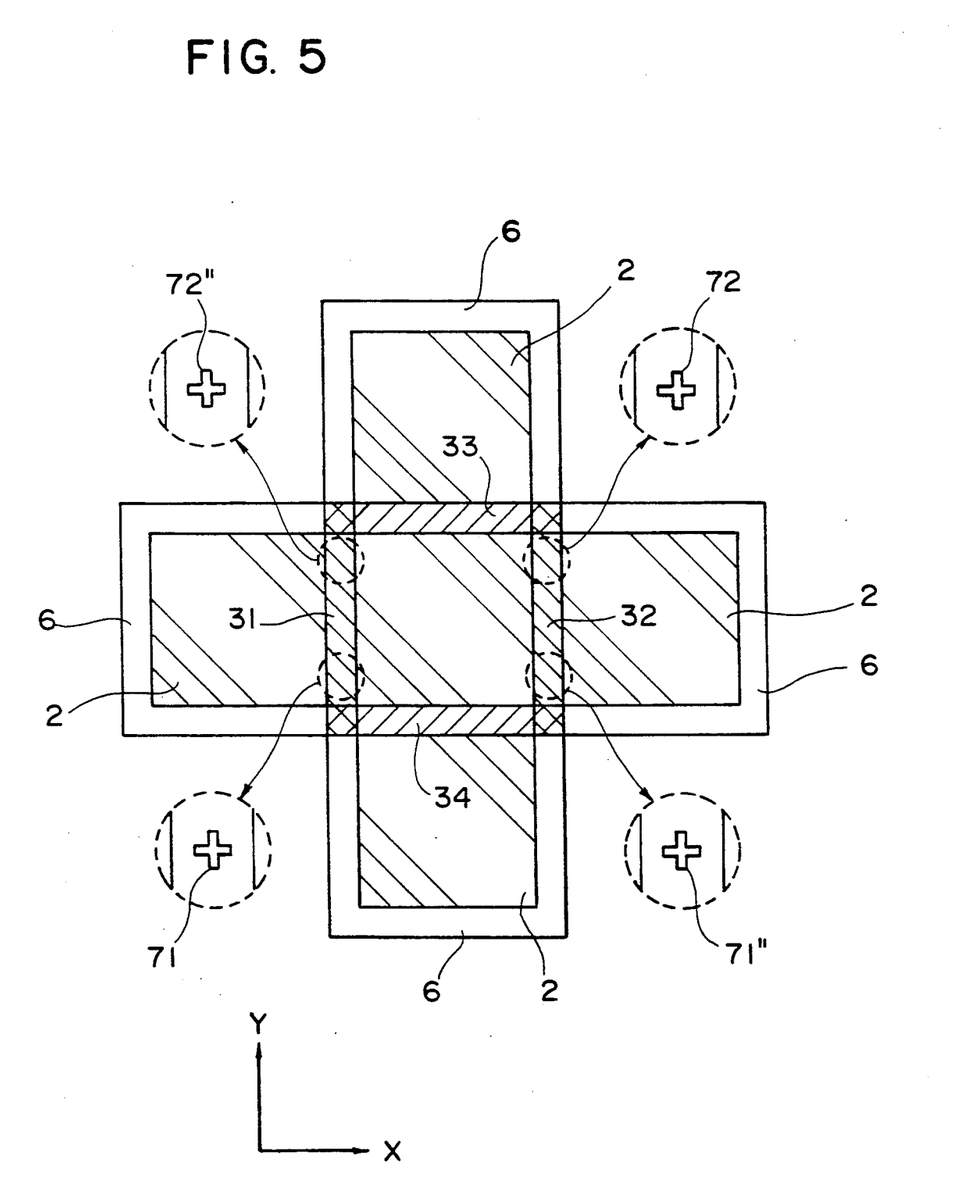
FIG. 5 is a five chips pattern after the repeat processing.

In FIG. 4, the chip pattern data (unit pattern data) from the SW UNIT 13 are sent to the overlapped pattern verifying apparatus 21 when the system 200 is set in the data verifying mode. In the overlapped pattern verifying apparatus 21, the chip pattern data from the SW UNIT 13 are sent to a repeat processing unit (REPEAT PROCESSING UNIT) 17 in which processing data for arranging five chip patterns (unit patterns) in X and Y directions as shown in FIG. 5 are provided. In FIG. 5, the same reference number as in FIG. 2 designates the same pattern as in FIG. 2. In FIG. 5, four small dotted circles indicate the positions of the subsidiary patterns appearing only under an overlap condition, and these subsidiary patterns are in two frame parts of the scribe frame, arranged in Y direction respectively. If the subsidiary patterns are always arranged thus in Y direction, three chip patterns would be enough to verify an overlapped state of the chip patterns, particularly the overlapping state of the subsidiary patterns. However, the subsidiary patterns can be positioned in the frame parts running in X direction respectively, of the scribe frame pattern. In this case, at least three chip patterns must be arranged in Y direction so as to be overlapped. For that reason, the repeat processing unit 17 provides the patterning data for arranging five chip patterns as shown in FIG. 5.

The output from the REPEAT PROCESSING UNIT 17 is sent to an overlapped region detecting unit (OVERLAPPED REGION DET UNIT) 18 in which overlapped regions obtained from the five chip patterns overlapped as shown in FIG. 5 are detected by pattern processing, producing: the overlapped pattern data such as the pattern data (the first pattern data) on regions (hatched regions 31 and 32 in FIG. 5) overlapped in X direction, the pattern data (the second pattern data) on regions (hatched regions 33 and 34 in FIG. 5) overlapped in Y direction, the pattern data (the third pattern data) on regions not overlapped in X direction, and the pattern data (the fourth pattern data) on regions not overlapped in Y direction; and not-overlapped pattern data.

Figure 6A:
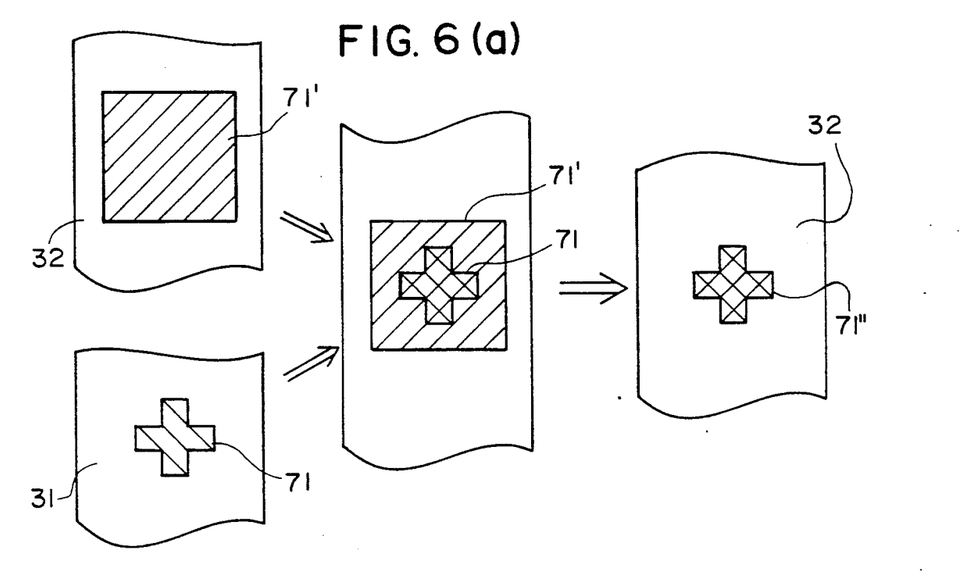
FIG. 6(a) is an illustration showing a pattern logical multiplication in regard to the negative subsidiary pattern.
Figure 6B:
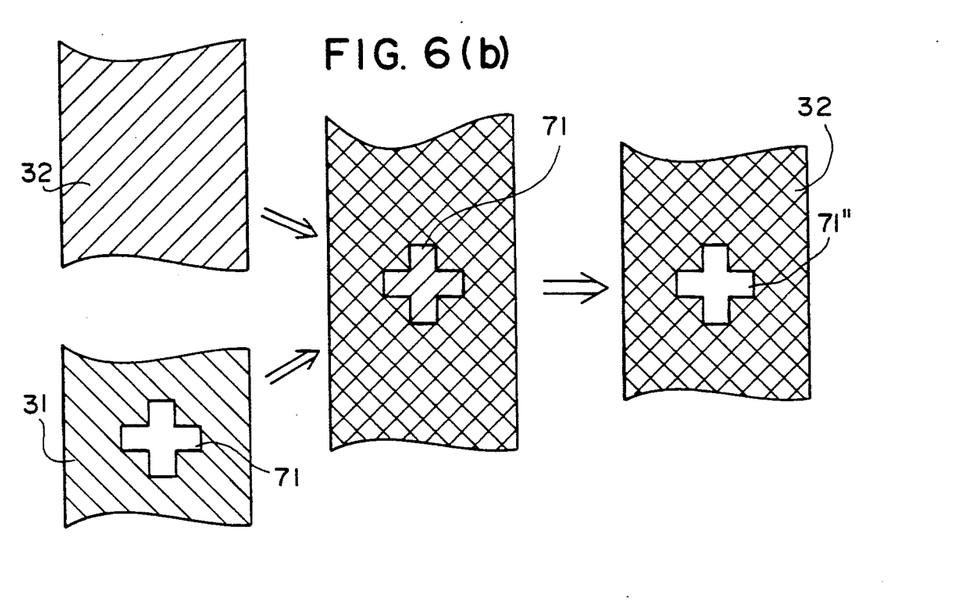
FIG. 6(b) is an illustration showing a pattern logical multiplication in regard to the positive subsidiary pattern.

The overlapped pattern data from the OVERLAPPED REGION DET UNIT 18 are sent to a pattern logically multiplying unit (PATTERN MULTIPLY UNIT) 19 in which the pattern logical multiplication is performed between the regions 31 and 32 and between the regions 33 and 34 respectively. This is for verifying whether the subsidiary patterns are obtained correctly on the substance for the photomask, whether the adding data on the margin patterns are correctly added into the system 200 in consideration of the adding data on the kind of the resist. FIG. 6(a) and 6(b) conceptually illustrate the pattern logical multiplication in regard to the subsidiary pattern. In FIGS. 6(a) and 6(b), the same reference number as in FIG. 2 or 5 designates the same pattern as in FIG. 2 or 5. FIGS. 6(a) and 6(b) show the conceptual illustration of the pattern logical multiplication when the adding data are based on the negative pattern and the positive pattern respectively.

In FIG. 6(a), since the adding data are based on the negative pattern, the data on the margin pattern are sent to the PATTERN MULTIPLY UNIT 19. Therefore, when the pattern logical multiplication, which will be called simply "multiplication" hereinafter, is performed between the data on the overlapped regions 31 and 32 in the PATTERN MULTIPLY UNIT 19, the multiplication is performed between the pattern data on the subsidiary pattern 71, by which the substance of the photomask is not etched, in the overlapped region 31 and the pattern data on the margin pattern 71' in the overlapped region 32 as shown by the middle illustration in FIG. 6(a). As a result, the PATTERN MULTIPLY UNIT 19 produces the multiplied pattern data on the subsidiary pattern 71'' appearing in the overlapped region 32 as shown by the illustration at the right hand side in FIG. 6(a). In the middle illustration in FIG. 6(a), hatched lines are crossed in the subsidiary pattern 71, which means that the subsidiary pattern 71 is left in the overlapped pattern 32 as shown by the subsidiary pattern 71'' so as not to be etched on the substance.

In FIG. 6(b), since the adding data are based on the positive pattern, no data on the margin pattern are sent to the PATTERN MULTIPLY UNIT 19. Therefore, when the multiplication is performed between the data on the overlapped regions 31 and 32 in the PATTERN MULTIPLY UNIT 19, the multiplication is performed between the pattern data on the subsidiary pattern 71, by which the substance of the photomask is etched, in the overlapped region 31 and no pattern data on the margin pattern in the overlapped region 32 as shown by the middle illustration in FIG. 6(b). As a result, the PATTERN MULTIPLY UNIT 19 produces the multiplied pattern data on the subsidiary pattern 71'' appearing in the overlapped region 32 as shown by the illustration at the right hand side in FIG. 6(b). In the middle illustration in FIG. 6(b), there is no crossed hatched lines in the subsidiary pattern 71, which means that the subsidiary pattern 71 is left in the overlapped pattern 32 as shown by the subsidiary pattern 71'' so as to be etched on the substance.

The multiplied pattern data from the PATTERN MULTIPLY UNIT 19 are sent to a data combining sub-unit (DATA COMB SUB-UNIT) 20 in which the overlapped pattern data are combined with the not-overlapped pattern data from the OVERLAPPED REGION DET UNIT 18, producing combined pattern data regarding the overlapped pattern shown in FIG. 5.

The combined pattern data from the DATA COMB SUB-UNIT 20 are sent to the PATTERN IND 16 in which the overlapped pattern shown in FIG. 5 is observed and verified whether the the chip circuit pattern 2 and the scribe frame pattern 6 are correct and are positioned correctly and particularly whether the subsidiary patterns correctly appear in the overlapped state of the chip patterns.

Applying the present invention to the verification of the chip pattern data, not only verifies the chip pattern data itself, but also the overlapped state of the chip pattern data, and particularly the pattern data on the subsidiary patterns in the overlapped scribe frame pattern.

As stated above, the present invention is applied to the verification of the chip pattern data used to the step-and-repeat process for fabricating a photomask. However, the present invention can be applied to the verification of the chip pattern data used to the step-and-repeat process for fabricating IC devices. This is because, the chip pattern data used to process the substance for the photomask can also be used to process the wafer for IC devices.

What is claimed is:

1. An apparatus for verifying unit pattern data used in a step-and-repeat process for regularly arranging unit patterns on a substance, the unit pattern data including data regarding a base pattern and a frame pattern which surrounds the base pattern and which includes subsidiary patterns, the step-and-repeat process arranges the unit patterns adjacently to each other so that the frame patterns become overlapped regions between the base patterns, said apparatus comprising:
  means for producing, from the unit pattern data, first pattern data regarding an overlapped pattern which includes a designated number of the unit patterns arranged in accordance with the step-and repeat process;
  means for producing, based on said first pattern data, overlapped pattern data regarding the overlapped regions and not-overlapped pattern data regarding regions of said overlapped pattern over than the overlapped regions;
  means for producing multiplied pattern data based on a logical multiplication of portions of said overlapped pattern data;
  means for producing combined pattern data by combining said multiplied pattern data with said not-overlapped pattern data; and
  means for producing, from said combined pattern data, a visual image of the base patterns, the frame patterns and the subsidiary patterns in accordance with the step-and-repeat process.

2. An apparatus for verifying chip pattern data used in a step-and-repeat process for regularly arranging chip patterns on a substance for fabricating a photomask, the chip pattern data including data regarding a chip circuit pattern and a scribe frame pattern which surrounds the chip circuit pattern and which includes subsidiary patterns, the step-and-repeat process arranges the chip patterns adjacently to each other so that the scribe frame patterns become overlapped regions between the chip circuit patterns, said apparatus comprising:
  first data producing means for producing, from the chip pattern data, first pattern data regarding an overlapped pattern which includes a designated number of the chip patterns arranged in accordance with the step-and-repeat process;
  second data producing means for producing, based on said first pattern data, overlapped pattern data regarding the overlapped regions and not-overlapped pattern data regarding regions of said overlapped pattern other than the overlapped regions;
  third data producing means for producing multiplied pattern data based on a logical multiplication of portions of said overlapped pattern data;
  forth data producing means for producing combined pattern data by combining said multiplied pattern data with said not-overlapped pattern data; and
  means for producing, from said combined pattern data, a visual image of the chip circuit patterns, the scribe frame patterns and the subsidiary patterns in accordance with the step-and-repeat process.

3. An apparatus for verifying chip pattern data used in a step-and-repeat process for regularly arranging chip patterns on a wafer for fabricating IC devices, the chip pattern data including data regarding a chip circuit pattern and a scribe frame pattern which surrounds the chip circuit pattern and which includes subsidiary patterns, the step-and-repeat process arranges the chip patterns adjacently to each other so that the scribe frame patterns become overlapped regions between the chip circuit patterns, said apparatus comprising:
  first data producing means for producing, from the chip pattern data, first pattern data regarding an overlapped pattern which includes a designated number of the chip patterns arranged in accordance with the step-and-repeat process;
  second data producing means for producing, based on said first pattern data, overlapped pattern data regarding the overlapped regions and not-overlapped pattern data regarding regions of said overlapped pattern other than the overlapped regions;
  third data producing means for producing multiplied pattern data based on a logical multiplication of portions of said overlapped pattern data;
  forth data producing means for producing combined pattern data by combining said multiplied pattern data with said not-overlapped pattern data; and
  means for producing, from said combined data, a visual image of the chip circuit patterns, the scribe frame patterns and the subsidiary patterns in accordance with the step-and-repeat process.

4. An apparatus according to claim 2, wherein said designated number includes five chip patterns arranged in the form of a cross having one chip pattern at the center of the cross.

5. An apparatus according to claim 3, wherein said designated number includes five chip patterns arranged in the form of a cross having one chip pattern at the center of the cross.

6. An apparatus according to claim 2, wherein said designated number includes at least three chip patterns arranged in a row.

7. A method of verifying unit pattern data used in a step-and-repeat process which overlapping arranges unit patterns on a substance, the unit pattern data including data indicative of a base pattern and a frame pattern which surrounds the base pattern and which includes subsidiary patterns, the step-and-repeat process arranges the unit patterns adjacently to each other so that the frame patterns become overlapped regions between the base patterns, comprising the steps of:
  producing, based on the unit pattern data, first pattern data indicative of an overlapped pattern which includes a designated number of the unit patterns arranged in accordance with the step-and-repeat process;
  producing, based on said first pattern data, overlapped pattern data indicative of the overlapped regions, and not-overlapped pattern data indicative of regions of said overlapped pattern other than the overlapped regions;
  producing multiplied pattern data by pattern logical multiplication of two portions of said overlapped pattern data;

producing combined pattern data by combining said multiplied pattern data with said not-overlapped pattern data; and displaying, based on said combined pattern data, at least the base patterns and the frame patterns in accordance with the step-and-repeat process.

8. A method as recited in claim 9, wherein the step of producing multiplied pattern data includes the substep of:

performing pattern logical multiplication of data indicative of the subsidiary patterns and one portion of said overlapped pattern data.

9. A method as recited in claim 9, wherein the step of producing multiplied pattern data includes the substep of:

determining whether the overlapped pattern data is a positive type or a negative type.

* * * * *